(12) United States Patent
Shiomi et al.

(10) Patent No.: US 6,849,939 B2
(45) Date of Patent: Feb. 1, 2005

(54) ELECTRONIC COMPONENT PACKAGE AND METHOD OF MANUFACTURING SAME

(75) Inventors: Kazuhiro Shiomi, Ibaraki (JP); Masaaki Ishio, Osaka (JP); Minoru Iizuka, Himeji (JP); Yoshikiyo Ogasawara, Himeji (JP)

(73) Assignees: Neomax Co., Ltd., Osaka (JP); Daishinku Corporation, Hyogo (JP)

( * ) Notice: Subject to any disclaimer, the term of this patent is extended or adjusted under 35 U.S.C. 154(b) by 40 days.

(21) Appl. No.: 10/363,395

(22) PCT Filed: Mar. 22, 2002

(86) PCT No.: PCT/JP02/02808

§ 371 (c)(1),
(2), (4) Date: Mar. 3, 2003

(87) PCT Pub. No.: WO02/078085

PCT Pub. Date: Oct. 3, 2002

(65) Prior Publication Data

US 2004/0023487 A1 Feb. 5, 2004

(30) Foreign Application Priority Data

Mar. 27, 2001 (JP) ........................................ 2001-893786

(51) Int. Cl.[7] .............................................. H01L 23/12
(52) U.S. Cl. ....................................... 257/704; 257/710
(58) Field of Search ................................ 257/704, 710, 257/678, 690

(56) References Cited

U.S. PATENT DOCUMENTS 5,909,056 A * 6/1999 Mertol ........................ 257/704

2003/0104651 A1 * 6/2003 Kim et al. .................. 438/106

FOREIGN PATENT DOCUMENTS

| JP | 10-135523 | 5/1998 |
| JP | 2000-058687 | 2/2000 |
| JP | 2000-106408 | 4/2000 |
| JP | 2000-164746 | 6/2000 |
| JP | 2000-223606 | 8/2000 |
| JP | 2000-277940 | 10/2000 |
| JP | 2001-077528 | 3/2001 |
| JP | 2001-274539 | 10/2001 |

* cited by examiner

Primary Examiner—Phat X. Cao
(74) Attorney, Agent, or Firm—Keating & Bennett, LLP

(57) ABSTRACT

An electronic component package includes a case having a cavity portion including an electronic component therein, and a lid member which is fusion-welded to the case via a fusion-welding layer to hermetically seal the cavity portion. The case has a first metal layer laminated on the case so as to be exposed on the open side at the cavity portion. The lid member has a core portion, and a second metal layer laminated on a side of the core portion facing the case. The fusion-welding layer has a soldering material layer formed of a soldering material, and first and second intermetallic compound layers disposed on opposite sides of the soldering material layer as a result of diffusion of a major component of the soldering material into the first metal layer and the second metal layer. The ratio of the area of the first and second intermetallic compound layers in a longitudinal section of the fusion-welding layer relative to the area of the longitudinal section of the fusion-welding layer is in a range of from about 25% to about 98%. This package maintains superior airtightness even when exposed to a high-temperature atmosphere, which is higher than the melting point of the soldering material.

6 Claims, 2 Drawing Sheets

ELECTRONIC COMPONENT PACKAGE AND METHOD OF MANUFACTURING SAME

BACKGROUND OF THE INVENTION

1. Field of the Invention

The present invention relates to an electronic component package including an electronic component contained therein.

2. Description of Related Art

Various electronic components, such as semiconductor devices, quartz crystal oscillators and piezoelectric vibrators, are often contained in respective electronic component packages in order for the electronic components contained therein to be protected from an external environment.

As disclosed in Japanese Patent Laid-Open Publication Nos. 2000-58687 and 2000-164746, known electronic component packages include a case having a cavity that opens at the upper portion of the case for containing an electronic component, and a lid member fusion-welded to a peripheral edge surface of the case surrounding the opening located at the upper portion of the case, i.e. a case opening portion, with a soldering material in order to hermetically seal the cavity. The cavity defines an electronic component containing space which shuts out the external environment when the lid member is fusion-welded to the case so as to close the cavity.

As described above, the lid member has Ni layers formed of Ni and laminated on opposite sides of a core portion formed of a metal having a low expansion coefficient, such as Kovar. Various solder materials including, for example, Sn—Ag alloys, Bi—Ag alloys and In—Sn alloys are usable as the aforementioned soldering material.

The fusion welding of the lid member to the case is performed at a temperature equal to or higher than the melting point of the soldering material. Generally, heating is done at a temperature that is 20° C. to 30° C. higher than the melting point of the soldering material for a relatively short time, which may be as short as some tens of seconds, to minimize formation of a brittle intermetallic compound resulting from a reaction between the soldering material and an Ni-based metal.

An electronic component package containing an electronic component therein is fixed at a predetermined position on a circuit board by soldering, along with other electronic components. For volume production and the like, a method of soldering different components to a circuit board simultaneously is usually used, and the method includes the steps of positioning the components such as the electronic component package and other electronic components on the circuit board, and passing the whole circuit board through a heating furnace.

In this way, the electronic component package is previously heated for the fusion welding of the lid member to the case containing the electronic component via the soldering material, and then heated again for the soldering of the package to the circuit board. When the soldering temperature at which the electronic components are soldered to the circuit board is higher than the melting point of the soldering material used in the fusion-welding of the lid member, the fusion-welding portion between the case and the lid member is melted again to cause pinholes or cracks to be formed at the fusion-welding portion, so that the airtightness of the electric component containing space in the package is significantly decreased. If the airtightness of the electronic component package is to be maintained high, there arises a problem that the soldering temperature at which the package is soldered to the circuit board is limited to a low temperature, which is lower than the melting point of the soldering material used for the fusion welding of the lid member, so that soldering materials that can be selected for use in the soldering to the circuit board are also limited.

SUMMARY OF THE INVENTION

In order to overcome the problems described above, preferred embodiments of the present invention provide an electronic component package having superior airtightness even when exposed to a high-temperature atmosphere, which is equal to or higher than the melting point of a soldering material used in the fusion welding of a lid member of the electronic component package.

An electronic component package according to a preferred embodiment of the present invention includes a case having a cavity portion containing an electronic component therein, and a lid member fusion-welded to a cavity opening portion of the case via a fusion-welding layer to close the cavity portion hermetically, the case having a first metal layer laminated on the case so to be exposed on the cavity opening portion, the lid member having a core portion, and a second metal layer laminated on a surface of the core portion at a side facing the case, the fusion-welding layer having a soldering material layer formed of a soldering material, and first and second intermetallic compound layers respectively provided on opposite sides of the soldering material layer as a result of diffusion of a major component of the soldering material into the first metal layer and the second metal layer, the ratio of the area of the first and second intermetallic compound layers in a longitudinal section of the fusion-welding layer to the area of the longitudinal section of the fusion-welding layer being in a range of from about 25% to about 98%.

In this electronic component package, the first and second intermetallic compound layers of the fusion-welding layer interposed between the case and the lid member are formed by diffusion of the major component of the soldering material into the first and second metal layers and hence are irregularly and unevenly shaped, and the soldering material layer is interposed therebetween in an involute condition. Since the first and second intermetallic layers having such a shape occupy about 25% to about 98% of the fusion-welding layer, the fusion-welding layer is hard to peel off and, in addition, is less susceptible to pinholes or micro-cracks even at the time of re-solidification of the soldering material layer subsequent to re-melting of the soldering material layer at a temperature equal to or higher than the melting point of the soldering material. For this reason, the electronic component package has superior airtightness even when exposed to a high-temperature condition higher than the melting point of the soldering material. If the area ratio of the first and second intermetallic compound layers is less than about 25%, the area of the first and second intermetallic compound layers having an uneven shape is so small that the soldering material layer becomes re-melted in an extended region between the first and second intermetallic compound layers when re-heated, resulting in easy formation of defects such as pinholes. On the other hand, if the ratio is more than about 98%, voids are likely to result during the irregular growth of the intermetallic compound layers so that cracks are formed and extend from such voids in the intermetallic compound layers, resulting in the package having significantly decreased airtightness as in conventional devices. Further, the amount of the soldering material sandwiched between the first and second intermetallic compound layers is reduced and, hence, the fusion-welding layer, as a whole, becomes brittle and exhibits decreased peel strength. Accordingly, the ratio of the area of the first and second intermetallic compound layers in the fusion-welding layer is preferably within the range of from about 25% to about 98%.

As described above, since the soldering material layer disposed between the first and second intermetallic compound layers is shaped in an involute condition between the first and second intermetallic compound layers as a result of being grown irregularly and unevenly by diffusion, the formation of pinholes or cracks in the soldering material layer is unlikely to occur even when the soldering material layer is re-melted by exposure of the package at a temperature equal to or higher than the melting point of the soldering material and, hence, the electronic component package according to preferred embodiments of the present invention exhibits superior airtightness even under a condition where it is exposed to a high-temperature atmosphere.

In a preferred embodiment of the package according to the present invention, the first metal layer and the second metal layer are preferably formed of pure Ni or an Ni-based alloy including Ni as a major component, while the soldering material layer is formed of an Sn-based solder alloy including Sn as a major component.

With the materials for respective layers thus selected, which are economical, an Ni—Sn-type intermetallic compound such as $Ni_3Sn_4$ can be quickly grown at a relatively low temperature, whereby the first and second intermetallic compound layers can easily be formed to have the predetermined ratio. Thus, the package has excellent productivity. In addition, it is possible to prevent deterioration in the characteristics of the electronic component contained in the package due to heating performed for the fusion welding.

In this case, use of a Pb-free Sn-based alloy as the Sn-based solder alloy is preferable. The use of such an alloy can avoid environmental pollution and detrimental influence upon human bodies due to Pb.

In another preferred embodiment, the fusion-welding layer is preferably formed to have a mean thickness of from about 10 μm to about 50 μm. If the mean thickness of the fusion-welding layer is less than about 10 μm, it is possible that local shortage of the soldering material occurs because of undulation of the joined surfaces reflecting the working precision with which the lid member and the case have been worked. In such a case, a fusion-welding failure results. On the other hand, if the mean thickness is more than about 50 μm, it is possible that an excess of the soldering material flows into the case during the fusion welding to contaminate the interior of the case. More preferably, the mean thickness of the fusion-welding layer is from about 15 μm to about 45 μm.

A method of manufacturing an electronic component package according to another preferred embodiment of the present invention includes a preparatory process of providing a case formed with a first metal layer at a cavity opening portion of a case body defining a cavity portion containing an electronic component therein and a surface metal layer laminated on the first metal layer for facilitating fusion welding, and a lid member having a second metal layer laminated on one side of a core portion, and a fusion-welding process of fusion-welding the lid member to the case. The fusion-welding process includes superposing the lid member on the case so that the second metal layer abuts the surface metal layer of the case via a soldering material, and holding the case and the lid member under heating to allow a major component of the soldering material to diffuse into the first metal layer and the second metal layer to form first and second intermetallic compound layers, which sandwich a soldering material layer formed of the remainder of the soldering material. In the fusion-welding process, the case and the lid member are held under heating to form a fusion-welding layer including the first and second intermetallic compound layers and the soldering material layer so that the ratio of the area of the first and second intermetallic compound layers in a longitudinal section of the fusion-welding layer to the area of the longitudinal section of the fusion-welding layer is about 25% to about 98% after the fusion-welding process is completed.

In a preferred embodiment of this manufacturing method, the first metal layer and the second metal layer are preferably formed of pure Ni or an Ni-based alloy including Ni as a major component, while the soldering material is preferably formed of pure Sn or an Sn-based solder alloy including Sn as a major component. The combination of these materials allows an Sn—Ni-type intermetallic compound layer to be formed easily by diffusion at a relatively low temperature. In addition, it is possible to prevent deterioration in the characteristics of the electronic component-contained in the package due to heating performed for the fusion welding. A Pb-free Sn-based alloy is preferable as the Sn-based solder alloy in terms of environmental protection and humans' health.

In another preferred embodiment, the case and the lid member are pressed against each other when they are held under heating. By so doing, the formation of voids can be prevented, which results in the fusion-welding layer having improved qualities.

In yet another preferred embodiment, the case and the lid member are heated at a temperature equal to or higher than the melting point of the soldering material to cause the soldering material to melt and then held at a temperature lower than the melting point of the soldering material when the case and the lid member are held under heating. With this two-stage heating technique for the fusion welding, the first heating at a temperature equal to or higher than the melting point of the soldering material causes the molten soldering material to contact sufficiently at once and adhere closely to the first and second metal layers. Subsequently, the growth of the intermetallic compound by diffusion, which takes a long time, is allowed to proceed at a relatively low temperature lower than the melting point of the soldering material and, hence, the first and second intermetallic compound layers can be grown to a predetermined amount, while thermal damage to the electronic component contained in the case is prevented as much as possible. For this reason, the method is capable of manufacturing an electronic component package having very high quality.

In still another preferred embodiment, the fusion-welding layer preferably has a mean thickness of from about 10 μm to 50 μm in order to avoid the occurrence of a fusion-welding failure and the contamination of the interior of the case.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

The inventors of the present invention have discovered that formation of a proper amount of an intermetallic compound, the formation of which has conventionally be considered to be inhibited as much as possible in the fusion welding of a lid member, makes it possible to maintain the airtightness of a package even when the package is re-heated to a temperature higher than the melting point of a soldering material used as well as to prevent deterioration in the peel strength of the lid member. Preferred embodiments of the present invention have been completed based on this discovery.

Hereinafter, preferred embodiments of an electronic component package according to the present invention along with a method of manufacturing the same will be described in detail with reference to the drawings.

Figure 1:
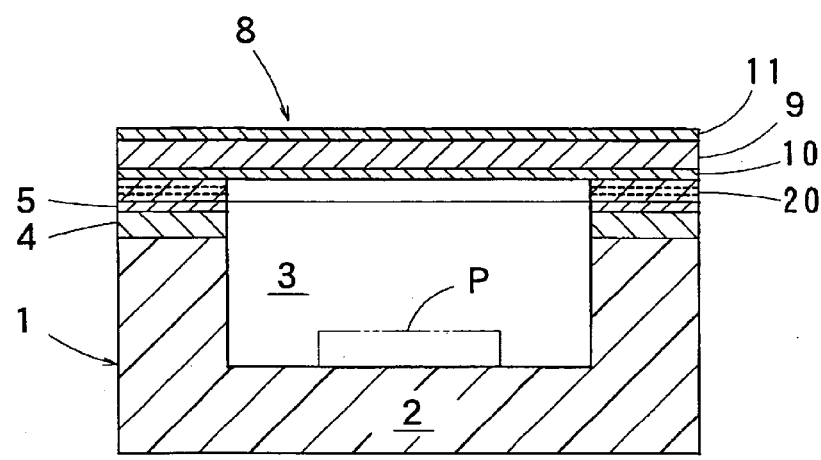
FIG. 1 is a schematic sectional view showing an electronic component package according to a preferred embodiment of the present invention.

FIG. 1 shows an electronic component package according to a preferred embodiment of the present invention, the package including a case 1 containing an electronic component P in a cavity portion 3 thereof, and a lid member 8 fusion-welded to a peripheral edge surface of the case 1 surrounding the opening of the cavity portion at a cavity opening portion of the case 1 via a fusion-welding layer 20 so as to hermetically seal the cavity portion 3.

The case 1 preferably includes a case body 2 preferably formed of a ceramic material and having the cavity portion 3, a metallized layer 4 laminated on and unified with the peripheral edge surface on the cavity opening portion of the case body 2 defining the opening of the cavity portion 3, and a first metal layer 5 laminated on and unified with the metallized layer 4. The metallized layer 4 is preferably formed of a high-melting-point metal such as W (tungsten) or Mo (molybdenum), while the first metal layer 5 is preferably formed of pure Ni or an Ni-based alloy including Ni as a major component (hereinafter both referred to as "Ni-based metal"). The Ni-based alloy is preferably an Ni alloy including Ni in an amount of preferably not less than about 20 wt %, more preferably not less than about 50 wt %, examples of which include about 80 wt % of Ni-Fe, about 80 wt % of Ni-Cr, about 65 wt % of Ni—Cu, about 45 wt % of Ni—Fe, about 42 wt % of Ni—Fe, about 36 wt % of Ni—Fe, and about 20 wt % of Ni-Cu.

The lid member 8, on the other hand, has a second metal layer 10 and a surface-protective metal layer 11, which are formed of the Ni-based metal and respectively laminated on and unified with opposite sides of a core portion 9. The core portion 9 is preferably formed of an Fe—Ni-based alloy or Fe—Ni—Co-based alloy including Fe, Ni or Co as a major component, such as Kovar, having a low expansion coefficient close to the thermal expansion coefficient of the ceramic used as the predominant material of the case 1. Examples of such alloys include an Fe—Ni alloy having an Ni content of from about 36 wt % to about 50 wt %, and an Fe—Ni—Co alloy having an Ni content of from about 20 wt % to about 30 wt % and a Co content of about 1 wt % to about 20 wt %. The surface-protective metal layer 11 is laminated on the upper surface of the core portion 9 in order to improve the corrosion resistance. The core portion 9 may be formed of a ceramic plate instead of the Fe—Ni-based alloy, or other suitable material.

Figure 2:
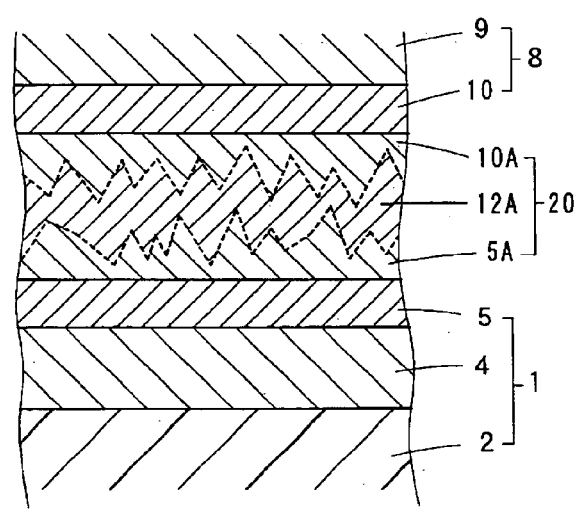
FIG. 2 is an enlarged sectional view of the fusion-welding layer of the electronic component package of FIG. 1.

As shown in FIG. 2, the fusion-welding layer 20 interposed between the case 1 and the lid member 8 preferably includes first and second intermetallic compound layers 5A and 10A arranged to be integral with the first metal layer 5 and the second metal layer 10, respectively, and a soldering material layer 12A sandwiched between the intermetallic compound layers 5A and 10A.

The soldering material layer 12A is preferably formed of pure Sn or an Sn-based solder alloy including Sn as a major component. The Sn-based solder alloy preferably includes Sn in an amount of about 85 wt % or more and may include any other appropriate component, such as Ag, Au, Cu, Zn, Pb, Bi, Sb or other suitable material, which can form eutectic or peritectic with Sn. Among these alloys, those of the type having an eutectic composition, such as Sn with about 3.5 wt % of Ag, Sn with about 10 wt % of Au and Sn with about 0.7 wt % of Cu, have low melting points and are quickly meltable as a whole and, hence, are suitable for fusion welding at low temperatures. Taking environmental pollution and detrimental influence on human bodies into consideration, Pb-free soldering alloys are preferable.

The first and second intermetallic compound layers 5A and 10A are formed as a result of diffusion of Sn forming a major component of the soldering material and Ni included in the Ni-based metal forming the first and second metal layers 5 and 10 during the fusion welding of the lid member 8 to the case 1. For this reason, as shown in FIG. 2, the first and second intermetallic compound layers 5A and 10A are irregularly and unevenly shaped and the intervening soldering material layer 12A formed of the remainder of the soldering material is unified with the first and second intermetallic compound layers in an involute condition between them. In a longitudinal section of the fusion-welding layer 20, the ratio of the area of the first and second intermetallic compound layers 5A and 10A relative to the overall area of the fusion-welding layer 20 is preferably about 25% to about 98%, and more preferably about 35% to about 93%. The areas of respective layers in the longitudinal section of the fusion-welding layer 20 can be determined from color contrasts between the layers of interest in a composition image photograph of the section taken by EPMA. Image analysis software is useful in the calculation of the area of each layer.

Figure 3:
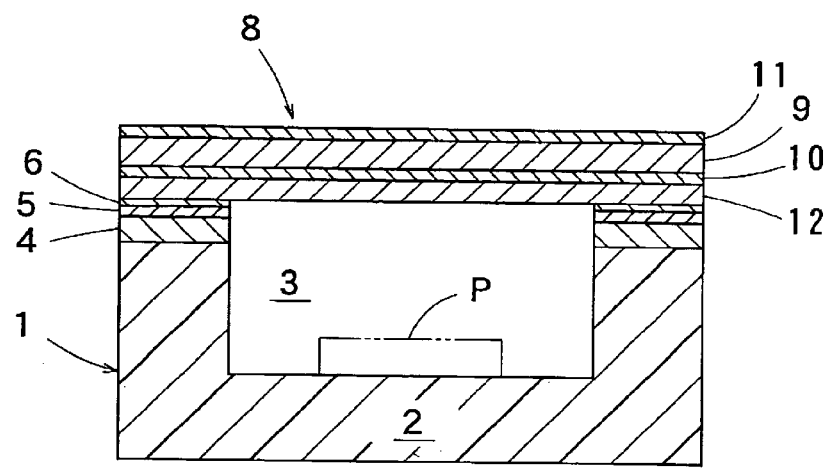
FIG. 3 is a schematic sectional view of a package assembly in a state before the fusion welding of a lid member in the electronic component package of FIG. 1.

FIG. 3 shows a package assembly in a state before the fusion welding of the lid member, the lid member 8 being placed on the open upper surface of the case 1. Though there are differences in the construction of the case before and after the fusion welding as described below, like reference characters are given to corresponding elements for convenience of description.

The case 1 in the state before the fusion welding, the construction of which is substantially the same as that of the state after the fusion welding to the lid member, is formed with a surface metal layer 6 of Au, for example, on the first metal layer 5 for facilitating the fusion welding. Since a very small thickness is sufficient for the surface metal layer 6, the surface metal layer 6 will be melted into the molten soldering material and disappear during the fusion welding. For this reason, the surface metal layer 6 is not shown in FIG. 1. The first metal layer 5 and the surface metal layer 6 are preferably formed through plating.

On the other hand, the lid member 8, the construction of which is basically the same as that of the lid member in the state after the fusion welding, has second metal layer 10 and surface-protective metal layer 11 respectively laminated on opposite sides of the core portion 9, and a soldering material layer 12 laminated on the second metal layer 10. The soldering material layer 12 of the lid member 8 in a state before the fusion welding will diffusion-react with the first and second metal layers 5 and 10 to form the first and second intermetallic compound layers 5A and 10A. Since the first metal layer 5 is absent in the opening portion of the case 1, only the second intermetallic compound layer will be formed in the corresponding portion as a corollary to the above. It is to be noted that the soldering material layer facing the opening portion of the case 1 in a state after the fusion welding is not shown in FIG. 1.

The lid member 8 is manufactured through a process preferably including the steps of pressure-welding a surface-protective metal layer forming material, a core portion forming material and a second metal layer forming material together to form a laminate, and blanking the laminate thus obtained to a desired size. Since the second metal layer is sufficient to have a thickness of about 5 $\mu$m, it may be formed through plating. In this preferred embodiment, the soldering material layer 12 is preferably formed to be integral with the second metal layer 10 of the lid member 8 by pressure welding. While the fusion-welding operability is improved by previously joining the soldering material with the lid member 8, the soldering material need not necessarily be unified with the lid member 8. In this case, it is sufficient to place a lid member preferably having a triple-layered structure including surface-protective metal layer 11, core portion 9 and second metal layer 10 on the case 1 via a separately-provided soldering material. Not only a thin-sheet soldering material but also a soldering material paste including a soldering alloy powder mixed into a flux is usable as such a soldering material that is separately provided.

In the fusion welding of the package assembly, merely melting and solidifying the soldering material is insufficient and it is required that the intermetallic compound layers be grown to the predetermined area ratio by diffusion. To realize fusion welding accompanying adequate growth of such an intermetallic compound, the package assembly is usually held at a temperature about 50° C. to about 250° C. higher than the melting point of the soldering material for about 300 seconds to about 1500 seconds. However, some types of electronic components may be deteriorated in their characteristics when they are held in a high-temperature condition for a prolonged time. In such a case, it is desirable to use such a process including the steps of holding the package assembly at a temperature about 10° C. to about 30° C. higher than the melting point of the soldering material for about 10 seconds to about 30 seconds to melt the soldering material, after having allowed the molten soldering material to contact the surfaces of the metal layers sufficiently, rapidly lowering the temperature to a package-holding temperature ranging from a point about 50° C. lower than the melting point of the soldering material to a point just short of the melting point, and holding the package assembly at the package-holding temperature for about 2 hours to about 20 hours to grow the intermetallic compound. This process makes it possible to obtain the intended fusion-welding layer 20 without deteriorating the characteristics of the electronic component contained in the package. It is to be noted that the melting point of a solder alloy such as an Sn-based solder alloy is equivalent to the eutectic temperature of the solder alloy.

In the fusion welding, it is sufficient to heat the package assembly with the lid member 8 preferably positioned under the case 1. It is, however, desirable that the package assembly be intentionally pressurized so that the case 1 and the lid member 8 are pressed against each other. By so doing, the formation of voids in the intermetallic compound during the fusion welding can be prevented, so that the stability of fusion welding can be improved. It is possible to use a pressurizing method such as to place a weight on the package assembly via a presser plate made of a material that does not react with the surface of the package assembly, e.g. a ceramic material, or a pressurizing method such as to bias the presser plate against the package assembly via a spring. The pressure to be applied preferably ranges from about $2 \times 10^{-4}$ N/mm$^2$ to about $1 \times 10^{-2}$ N/mm$^2$.

Usually, heating for the fusion welding is performed in a vacuum or in an inert gas atmosphere. The fusion welding in a vacuum or an inert gas atmosphere such as nitrogen gas makes it possible to prevent the electronic component from being oxidized by heating as well as to form an electronic component containing space provided with a vacuum or an inert gas atmosphere after the fusion welding. Thus, the electronic component can be prevented from changing with time. Particularly where an oscillator such as a quartz crystal oscillator is contained in the package, it is desirable from the viewpoint of improvement in resonance characteristics that the fusion welding be performed under vacuum.

Hereinafter, the present invention will be described more specifically by way of examples to be described below. These examples and the foregoing preferred embodiments in no way can be construed to limit the scope of the present invention.

EXAMPLES OF PREFERRED EMBODIMENTS OF THE PRESENT INVENTION

Figure 4:
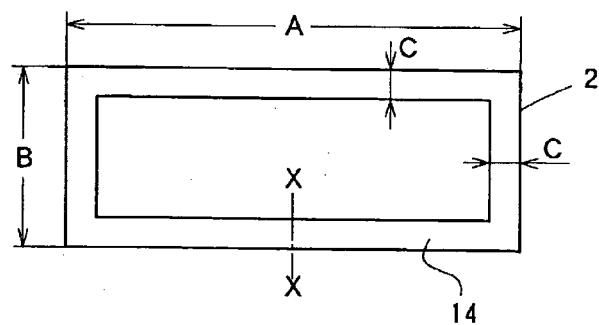
FIG. 4 is a top plan view of a case used in the electronic component package.

Cases were provided each having a W metallized layer (thickness of about 30 $\mu$m), an Ni layer (thickness of about 15 $\mu$m) and an Au layer (thickness of about 1 $\mu$m), which had been stacked in that order on a peripheral edge surface of a case body formed of a ceramic at the cavity opening portion, the peripheral edge surface surrounding the opening of a cavity defined in the case body. Lid members, which were separately provided, were each superposed on the Au layer side of each case via a soldering material to provide package assemblies. As shown in FIG. 4, each case was approximately sized in top plan as follows: length A=4.1 mm, overall width B=2.6 mm, and width C=0.35 mm, width C which is the width of peripheral edge surface 14 on the cavity opening portion from the outer periphery of the case to the inner periphery of the cavity portion. The planar size of each lid member was substantially equal to that of each case.

Each lid member had been manufactured through a process including the steps of pressure-welding an Ni sheet (Ni layer forming material) onto each of the opposite surfaces of an Fe—Ni—Co alloy sheet (core forming material) including about 29 wt % of Ni, about 16 wt % of Co, and Fe forming the balance, reducing the resulting laminate to a predetermined thickness by pressing, and blanking the reduced laminate to a predetermined planar size. The lid member had a triple-layered structure in which a Ni layer that was about 5 $\mu$m thick was laminated with a core portion that was about 80 $\mu$m thick on each of the opposite surfaces of the core portion. As the soldering material, an Sn-based soldering alloy sheet including about 10 wt % of Ag and Sn forming the balance (eutectic point of about 220° C.) or an Sn-based solder alloy powder of an eutectic composition including about 3.5 wt % of Ag and Sn forming the balance (eutectic point of about 220° C.), was used. The Sn-based soldering alloy sheet was used as previously pressure-welded to a lid member. The thickness of each of the resulting soldering material layers formed by the pressure welding is shown in Table 1. The Sn-based alloy powder was mixed with a flux to form a paste.

Each of the package assemblies was placed on a pad plate with its lid member positioned under its case. For some package assemblies, a weight was placed on a ceramic plate set on each package assembly so that a pressure of about $2\times10^{-3}$ N/mm$^2$ worked on the fusion-welding portion. The package assemblies were heated in a vacuum (about 0.1 Pa) or in a nitrogen gas atmosphere (about 0.1 MPa). Table 1 also shows the fusion-welding conditions. Samples Nos. 9 and 10 in Table 1 were packages each manufactured through a process including the steps of holding the package assembly at about 240° C. for approximately 15 seconds to melt the soldering material, rapidly lowering the temperature, and holding the package assembly at about 200° C. for approximately 10 hours.

TABLE 1

| Sample No. | Soldering Material Layer Thickness µm | Fusion-welding Condition Temperature ° C. *Holding Time | Fusion-welding Atmosphere | Pressurization Performed: ○ Not Performed: x | Reflow Performed: ○ Not Performed: x |
|---|---|---|---|---|---|
| 1 | 30 | 270*20 s | Vacuum | ○ | ○ |
| 2 | 30 | 270*20 s | Vacuum | x | x |
| 3 | 30 | 320*800 s | Vacuum | ○ | ○ |
| 4 | 30 | 320*1200 s | Vacuum | x | ○ |
| 5 | 20 | 200*5 hr | Vacuum | ○ | x |
| 6 | 20 | 425*800 s | Vacuum | ○ | ○ |
| 7 | (Paste) | 290*200 s | Vacuum | ○ | ○ |
| 8 | (Paste) | 290*200 s | Vacuum | ○ | x |
| 9 | (Paste) | 240*15 s + 200*10 hr | N$_2$ Gas | ○ | ○ |
| 10 | (Paste) | 240*15 s + 200*10 hr | N$_2$ Gas | ○ | x |

After the fusion welding, each package was vertically cut along the center of the length and the surface of the longitudinal section (taken along line X—X in FIG. 4) was observed by EPMA. A composition image photograph of the longitudinal section was analyzed with image analysis software to determine the areas of the first and second intermetallic compound layers and the soldering material layer and the thickness of the fusion-welding layer. The image analysis software used was Image-Pro, which is the commercial name of a product of MEDIA CYVERNETICS.

Some of the packages having undergone fusion welding were subjected to reflow (re-heating) by holding the packages at about 260° C. for approximately 30 seconds and then cooled for use as airtightness test samples. All the samples were tested as to their airtightness in the following manner. Each of the samples was first placed in a hermetically-sealed vessel. After having reduced the pressure within the vessel to about 0.1 kPa, the sample was pressurized with He gas at about 0.5 MPa for about 2 hours to provide a sample to be evaluated. Then, the amount of He emitted from the sample was measured with an He detector. A package having a measured value of approximately $1\times10^{-9}$ Pa·m$^3$/sec or less was considered to have permitted no infiltration of He gas into the package, packages exhibiting this value or less were regarded as passing the test. Further, the packages having passed the He gas detection test were immersed in fluorocarbon to check whether or not the generation of indiscrete gas bubbles occurred. Those packages which did not allow generation of indiscrete gas bubbles were regarded as finally passing the test. The results of the observation as well as the results of the measurement are shown in Table 2.

TABLE 2

| Sample No. | Area of Soldering Material Layer: B µm$^2$ | Total Area of Intermetallic Compound Layers: I µm$^2$ | Area Ratio I/(B + I) % | Fusion-welding Layer Thickness µm | Airtightness Passed: ○ Rejected: x |
|---|---|---|---|---|---|
| *1 | 2053 | 326 | 13.7 | 31.0 | x |
| *2 | 1256 | 366 | 22.5 | 21.0 | ○ |
| 3 | 747 | 476 | 38.9 | 16.3 | ○ |
| 4 | 894 | 326 | 26.7 | 16.3 | ○ |
| *5 | 1646 | 204 | 11.0 | 24.7 | x |
| 6 | 642 | 988 | 60.6 | 21.7 | ○ |
| 7 | 195 | 1433 | 88.0 | 21.7 | ○ |
| 8 | 22 | 757 | 97.1 | 10.4 | ○ |
| 9 | 108 | 1087 | 90.9 | 15.9 | ○ |
| 10 | 112 | 1463 | 92.8 | 21.0 | ○ |

Note: a sample number with an asterisk is indicative of a comparative example.

As seen from Table 2, sample No. 1 having intermetallic compound layers, the area ratio which did not meet the requirements of preferred embodiments of the present invention, exhibited airtightness deteriorated by reflow at about 260° C. and hence was regarded as rejected. On the other hand, sample No. 2, which had not been subjected to reflow, exhibited satisfactory airtightness though the area ratio of its intermetallic compound layers did not meet the requirements of preferred embodiments of the present invention. Since sample No. 5, which was subjected to a fusion-welding temperature lower than the melting point of the soldering material, did not allow a liquid phase to result, the soldering material contacted the first and second metal layers insufficiently, with the result that the area ratio of the resulting intermetallic compound layers did not reach the predetermined value in spite of prolonged heating. For this reason, sample No. 5 exhibited decreased airtightness. In contrast, samples Nos. 3, 4 and 6 to 10 within the scope of the present invention, which were each formed with intermetallic compound layers having an area ratio falling within the predetermined range, exhibited superior airtightness. It is to be noted that samples Nos. 1 and 2 as comparative examples were close to the prior art but were subjected to a heating temperature higher than that according to the prior art.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An electronic component package comprising:
   a case having a cavity portion having an opening portion and containing an electronic component therein;
   a fusion-welding layer; and
   a lid member that is fusion-welded to the cavity opening portion of the case via the fusion-welding layer to hermetically seal the cavity portion of the case; wherein
   the case includes a first metal layer laminated on the case so as to be exposed on the cavity opening portion;
   the lid member includes a core portion, and a second metal layer laminated on a side of the core portion facing the case;

the fusion-welding layer having a soldering material layer made of a soldering material, and first and second intermetallic compound layers respectively disposed on opposite sides of the soldering material layer and formed as a result of diffusion of a major component of the soldering material and each major component of the first metal layer and the second metal layer, and a ratio of an area of the first and second intermetallic compound layers in a longitudinal section of the fusion-welding layer to an area of a longitudinal section of the fusion-welding layer is in a range of from about 25% to about 98%.

2. The electronic component package according to claim 1, wherein the first metal layer and the second metal layer are made of one of pure Ni and an Ni-based alloy including Ni as a major component, and the soldering material layer is made of an Sn-based solder alloy including Sn as a major component.

3. The electronic component package according to claim 2, wherein the Sn-based solder alloy is Pb-free.

4. The electronic component package according to claim 1, wherein the fusion-welding layer has a mean thickness of from about 10 $\mu$m to about 50 $\mu$m.

5. The electronic component package according to claim 2, wherein the fusion-welding layer has a mean thickness of from about 10 $\mu$m to about 50 $\mu$m.

6. The electronic component package according to claim 3, wherein the fusion-welding layer has a mean thickness of from about 10 $\mu$m to about 50 $\mu$m.

* * * * *